United States Patent
Maher

(10) Patent No.: US 7,535,309 B2
(45) Date of Patent: May 19, 2009

(54) LOW POWER, TEMPERATURE AND FREQUENCY, TUNABLE, ON-CHIP CLOCK GENERATOR

(75) Inventor: Gregory A. Maher, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 210 days.

(21) Appl. No.: 11/430,706

(22) Filed: May 9, 2006

(65) Prior Publication Data

US 2007/0273453 A1 Nov. 29, 2007

(51) Int. Cl.
*H03L 1/02* (2006.01)
(52) U.S. Cl. ........................ 331/176; 331/185
(58) Field of Classification Search ................ 331/66, 331/176, 185
See application file for complete search history.

(56) References Cited

U.S. PATENT DOCUMENTS 5,317,287 A * 5/1994 Brown .................... 331/57
5,719,533 A * 2/1998 Shibuya et al. .............. 331/176
6,191,660 B1 2/2001 Mar et al.

* cited by examiner

*Primary Examiner*—Benny Lee
*Assistant Examiner*—James E Goodley
(74) *Attorney, Agent, or Firm*—Cesari and McKenna, LLP; Edwin H. Paul, Esq.

(57) ABSTRACT

A tunable, low power clock generator employs a voltage regulator, one or current generators and a variable resistor bank that, together, produce a control voltage for trimming a VCO. The control voltage is arranged to also compensate, at least, for the variables of temperature, supply voltage and fabrication processes as they affect the VCO output frequency. The current generator is well characterized over the variables discussed and the resistor bank is a flexible series/parallel array of resistors made from differing materials exhibiting different temperature coefficients. The resistor bank provides for various overlapping resistance values simultaneously with various overlapping temperature coefficients wherein the temperature coefficient profile of the clock generator over frequency and temperature is controlled.

14 Claims, 6 Drawing Sheets

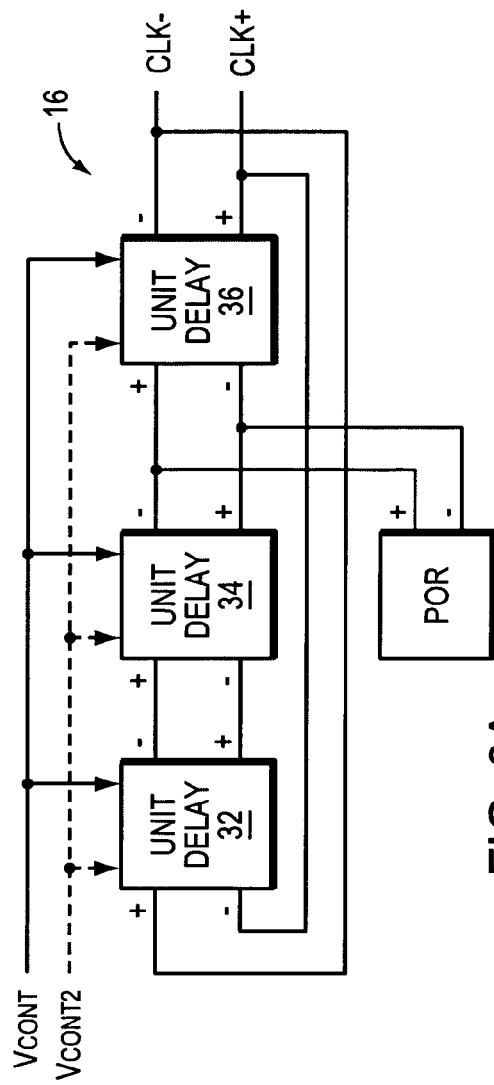
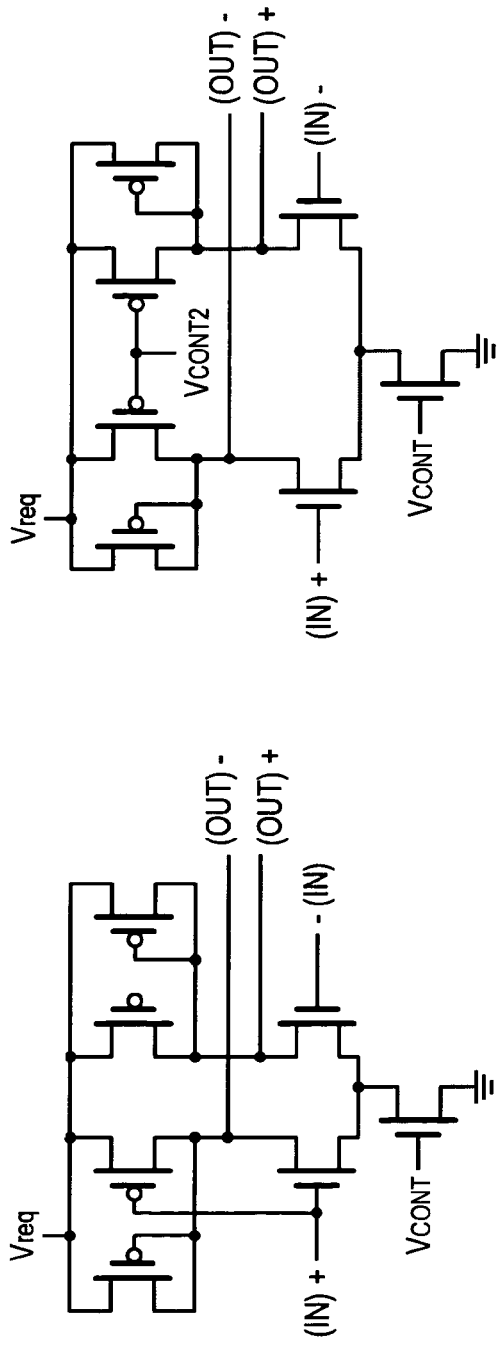
FIG. 3A
FIG. 3B
FIG. 3C

LOW POWER, TEMPERATURE AND FREQUENCY, TUNABLE, ON-CHIP CLOCK GENERATOR

BACKGROUND OF THE INVENTION

1. Field of the Invention

The present invention relates to clock generators and more particularly to crystalless, trimmable, low power clocks where temperature, supply voltage and fabrication processes are compensated over operating variables. Herein "trim" refers to the composite of tuning the output frequency itself and the output frequency's sensitivity to temperature, and chip fabrications processes that affect offsets and other known circuits variations.

2. Background Information

Precision crystal clocks are found in many digital systems (e.g., communications, computing, instrumentation) since they produce a frequency that is stable over temperature, the supply voltage and with respect to the processing steps that produce any associated electronics found in such digital systems. A crystal is limited to one frequency, but other frequencies may be produced using phase locked loops and other such related circuitry. However, crystals remain limited in frequencies that may be generated, they are comparatively bulky, costly and must be added to, rather than fabricated with, the integrated circuitry found in modern high density digital electronics. Hence there digital circuit designers are continuing to replace crystal clocks with electronic designs that are fabricated integral (as part of at the same time) with the digital system electronics.

Commonly found clock circuits, not using crystals, include VCO's (Voltage Controlled Oscillators of various types) and ICO's (Current Controlled Oscillators. Delay circuits e.g., inverters, may be arranged in a feedback ring or RC's (Resistor-Capacitor) arranged in a feedback circuit to form an oscillator. The design issues of all such clock circuits include variations that change the designed frequency. These variables include, most prominently, those introduced by: the processes by which the circuits are made; supply voltage changes, and temperature changes. This group of variables is commonly referred to as PVT (Process, Voltage, and Temperature).

It is common to find variations over the PVT ranges that apply to most digital circuits of as much +/−10% or more. Laser trimming may reduce this percentage, but still the variations found in the known art are often unacceptable. U.S. Pat. Nos. 6,191,660 and 6,798,299, assigned to Cypress Semiconductor Corp, of San Jose, Calif. are directed to crystal-less clocks. Both of these patents are hereby incorporated herein by reference. These designs offer trimming of components and functions, e.g., DACs (Digital to Analog Converters), other electronic components (resistors, capacitors, transistors, etc.) and current sources. However, the designs found in these patents consume high power and do not account for power supply variations that affect frequency. Moreover, is these patents disclose trimming to a reference current that is uncontrolled. Such a current is mirrored in such a way as to "overdrive" the clock thus further magnifying power consumption. These patents provide temperature compensate in the oscillator but do not disclose a circuit or method to trim the temperature coefficient of the circuitry generating the clock. Moreover none compensate for post fabrication temperature effects as does an embodiment of the present invention.

The present invention is directed to improving upon the limitations found in the prior art.

SUMMARY OF THE INVENTION

The present invention provides a current generator/resistor bank that provides a control signal to a VCO that are powered by a regulated supply. The current generator is preferably one whose current is proportional to the absolute temperature (IPTAT), and the resistor bank is a flexibly selectable series/parallel group of resistors. Logic signal patterns select the resistor bank combinations wherein the resulting equivalent resistances and their temperature coefficients overlap each other. The net result is that the IPTAT and the resistor bank can be selected to offset the temperature effects of the VCO output frequency.

In addition the VCO output frequency may be trimmed by the resistor bank selection while compensating for temperature. The resistor bank selection allows post fabrication setting of the VCO frequency and in so doing compensates for process anomalies and offsets as well as temperature variations. In preferred embodiments the number of logic signals may be determined by the application, but as little as eight to as many as thirty-two may be used in preferred embodiments.

A second IPTAT may be used with a resistor and band gap diode to generate a reference voltage to power the VCO and the first IPTAT, and any other amplifiers that may be employed.

The resistors in the resistor bank are made from different materials to achieve the is spread of resistance values and temperature coefficients desired.

In other examples the current generator and the resistor bank may be arranged to provide two inputs to the VCO. The VCO may be designed to accept the two control signals and advantageously provide closer frequency control.

A self-biasing output differential input amplifier may be used to better control the duty cycle of the output frequency signal.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 3A is a block diagram of a ring type VCO circuit;

FIG. 3B is a schematic of a unit delay circuit that may be used in FIG. 3A;

FIG. 3C is a schematic of another delay unit that may be used in FIG. 3A;

DETAILED DESCRIPTION OF AN ILLUSTRATIVE EMBODIMENT

Figure 1:
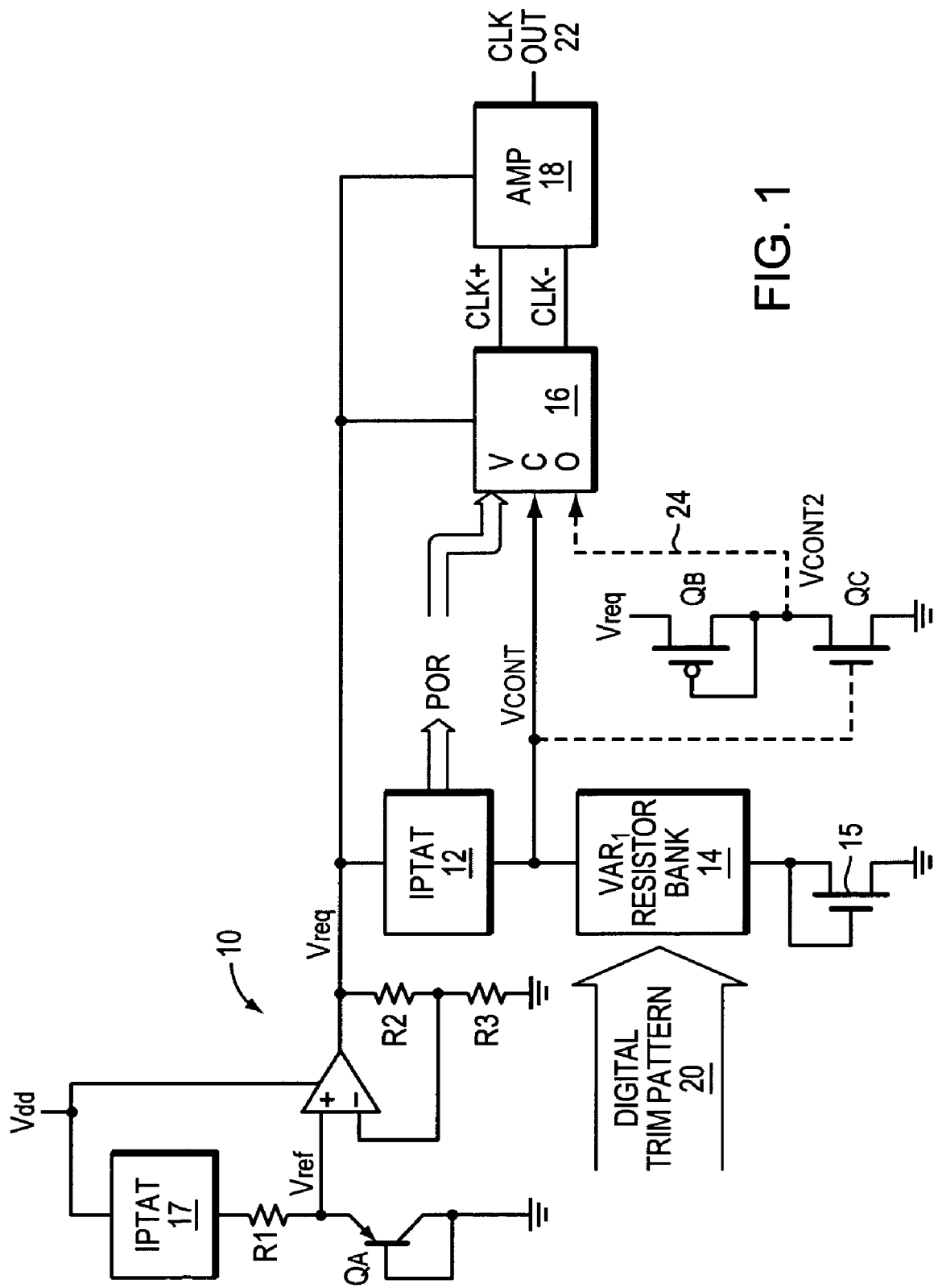
FIG. 1 is a block diagram illustrating the present invention.

FIG. 1 is a block diagram illustrating an embodiment of the present invention. There are five primary blocks: a Vreg voltage regulator 10, an IPTAT 17 (a current generator with a current output proportional to the absolute temperature), a PNP, QA, and R1 circuit that produces a Vref, a second IPTAT 12, a variable resistor bank 14, a VCO 16, and a self-biasing amplifier 18. A digital input trim pattern 20 determines the values of the resistor bank 14. The circuit of FIG. 1 provides a clock output, CLK OUT 22, using standard devices integrated on chip and having no crystal. The design consumes low power, is tunable by the digital trim pattern 20 from at least 160 to 360 MHz, has multiple temperature compensations, and is relatively independent of the Vdd power supply. Vdd may run from at least +1.775V to +5.5V.

In one preferred embodiment, regulator 10 provides a Vreg of +1.7V output, but other values may be generated. Not shown, but in other preferred embodiments a second voltage regulator may be used to allow Vdd to reach the +5V level. The use of the +1.70 regulator typically decreases the influence of supply voltage (Vdd) on the output clock frequency by a factor of 15 or more.

The voltage regulator 10 is shown as an operational-type amplifier with an input of Vref that is proportional to the Vbe of QA. In this case QA is biased to support a band gap reference generating a Vref of about 1.15V. The feedback resistors R2 and R3 multiply Vref by their ratio to produce Vreg. The temperature coefficients of R1 and Vbe of QA can be compensated for the IPTAT 17. The IPTAT produces a current that is proportional to the absolute temperature, while typically a Vbe demonstrates a negative temperature coefficient the resistor will have a compensating positive temperature coefficient. The resistors in the IPTAT 17 can be arranged with different temperature coefficients, as known in the art, in order to produce a positive or negative coefficient at some selected resistance value in order to compensate for other components. The temperature coefficients of the diode, resistor R1, the IPTAT 17 may be balanced among themselves as known to those skilled in the art to provide a specific temperature coefficient profile for Vreg. The present invention allows for variations due to temperature differences that are non-linear over the temperature range of use. See FIG. 7. Herein temperature coefficient and temperature coefficient profile are used interchangeably with context.

Even with the compensation, Vreg regulator typically will have a positive temperature coefficient. But the IPTAT 12 and the Variable ResBank 14 are arranged to provide a temperature compensated Vcont signal that sets the operating frequency of the VCO 16. The IPTAT 12 and resistor bank 14 may be arranged to compensate for the temperature coefficients of the regulator and that of the VCO itself. Moreover, the temperature compensation profile may be non-linear and, for example, the temperature-frequency profile may be arranged in a "bow" (FIG. 7) where the temperature coefficient differences are distributed among the ends and the middle of the profile such that the total error measured across the entire temperature range is minimized.

The VCO 16 may be a type using one (Vcont) or two (Vcont and Vcont32) control inputs. In one embodiment, Vcont2 is formed by the structure of QB and QC shown in dotted lines. The sizes and characteristics of the PMOS (QB) and NMOS (QC) can be arranged to provide an inverted form of Vcont with voltage ranges as would be known to those skilled in the art. When using two control signals, illustrated by the dotted line 24 in FIG. 1, the design may provide for different temperature coefficients for each of the Vcont and Vcont2 signals. This allows the designer substantial flexibility in "trimming" the temperature coefficients of the final clock output frequency.

FIG. 1 illustrates the VCO 16 output connected by CLK+ and CLK− to a self-biasing amplifier 18 from which a clock output, CLKOUT 22, is taken.

The variable resistor bank 14 present a variable resistor with variable temperature coefficients. The specific resistor and temperature coefficient values are determined with a digital trim input set of signals 20. In this manner the VCO frequency and temperature coefficient of the system may be changed at virtually any time, and the temperature coefficient of the functions may be trimmed to meet virtually any specific requirement.

FIG. 1 also illustrates a function that when power is first applied, a POR (Power On Reset) triggers the VCO that is designed to ensure the VCO starts oscillating.

Figure 2:
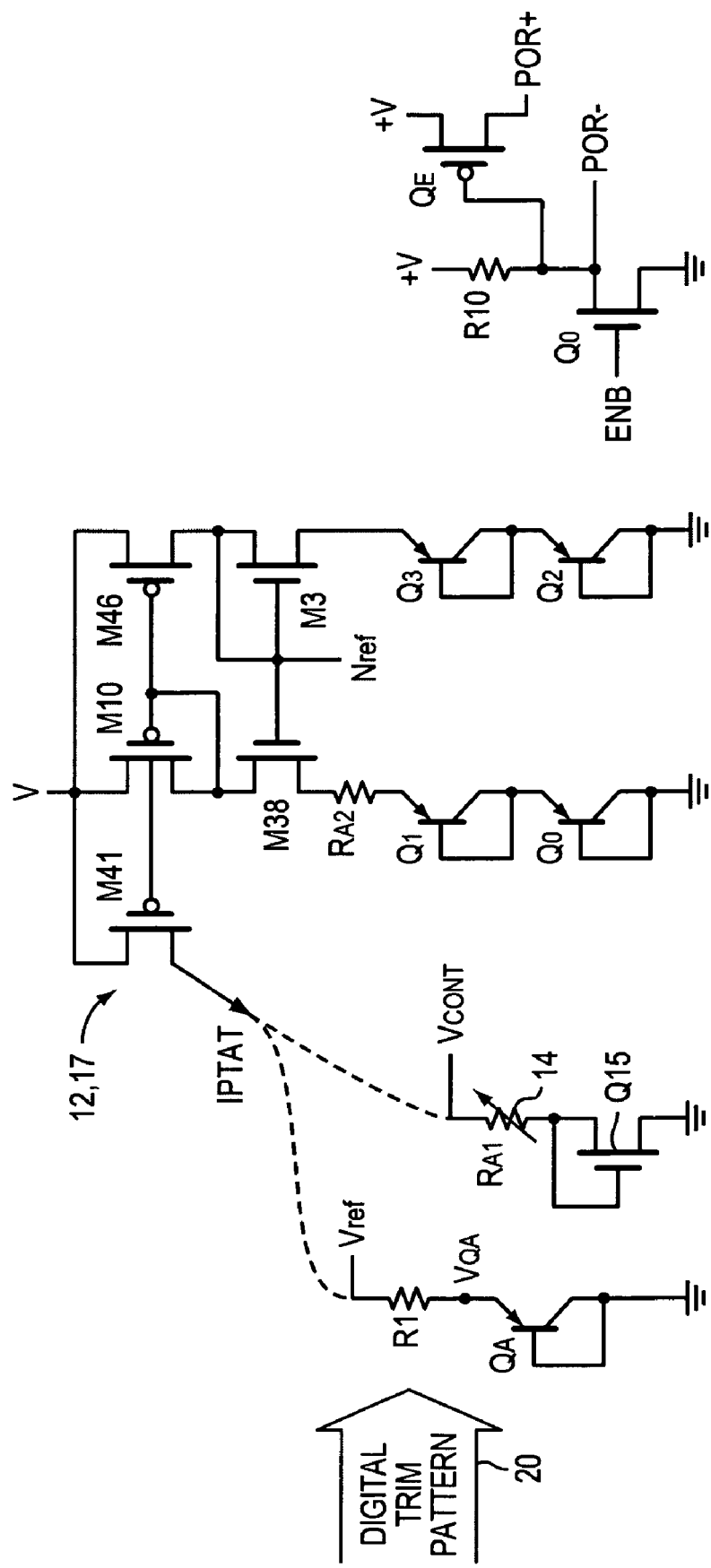
FIG. 2 is an illustrative circuit diagram of an IPTAT creating a control voltage and a reference voltage.

FIG. 2 illustrates the operation of the IPTAT circuits 12 and 17 working into the series R1 and diode connected QA and into the variable resistor bank 14. Here QA is arranged to act as a band gap diode. An output Vref is a temperature compensated voltage that provides power to the voltage regulator 10 that, in turn, out puts Vreg. In each case IPTAT 12 and 17 operate in a similar fashion as discussed below.

In FIG. 2, M3 and M38 are current mirrors and M46 and M10 are current mirrors. In one embodiment M3 and M46 are sized smaller than M38 and M10 so the mirrors currents will be proportional to those size differences. Such design is known to those skilled in the art. Q0 and Q1 are stacked diode connected pnp bipolar transistors as are Q2 and Q3. M10 and M41 are also current mirrors where the current IPTAT is the mirror of the current through M1 (assuming they are the same size). The current through M10 is determined ultimately by the current through M3/M46.

The voltage drop across RA2 will be the difference between the base-emitter drops of Q0 and Q1 compared to those of Q2 and Q3. Consider the VBE's (base-emitter voltages) of Q0 and Q1 are equal to each other and those of Q2 and Q3 are equal to each other. Therefore the voltage different will be [2Vbe(Q2)−2VBE(Q0)]. The current IRA1 will be that voltage difference divided by RA2. If M10 and M41 are of the same size IPTAT will equal IRA1.

Since, in one embodiment, there is a 20 to 1 size difference between Q0 and Q2, the difference between the VBE's with this size difference will equal (VT)ln20, where ln20=3.

So IPTAT=2(VT)3/RA2. In this case Vcont will be IPTAT (RA1)+V15.

In the case where IPTAT drives R1 and QA, Vref will be the IPTAT(R1)+VQA.

FIG. 2 also includes the POR circuit. Here an enable signal, ENB, is formed that is high when the clock generator operation is disabled. So POR− is low (R10 is very large) and POR+ is high and inhibits operation, as discussed below, by over powering the outputs of item 34 of FIG. 3A when the clock generator is disabled. When the clock generator is enabled, ENB goes low, QD and QE are turned off and item 34 of FIG. 3A operate to ensure the VCO 16 begins oscillating.

FIG. 3A is a delay ring type VCO circuit. Here there are three delay units, 32, 34, and 36 that each produce an inverted signal after a delay with respect to their respective input signals. Note the "−" and "+" relationship between the input and output of each delay unit. The arrangement produces an unstable circuit that will oscillate. For example, if CLK− is low and CLK+ is high, the − output of unit delay 32 is high, the − output of delay unit 34 is low, and the low into the + input of delay unit 36 will drive the CLK− high. That is the low at CLK− will after three units delay times drive itself high and that high will drive CLK− low again after three unit delays. The result is a free running clock.

FIG. 3A illustrates an arrangement that may be designed with one control input Vcont or two control inputs, Vcont and Vcont2. These control signals from the IPTAT 12 and resistor bank 14 are arranged to control the unit delay times. FIG. 3B represents a circuit for a unit delay using the single control signal Vcont, and FIG. 3C illustrates a unit delay circuit using both control signals. Operations of these circuits of FIGS. 3A, 3B, and 3C are known to those skilled in the art.

The VCO 16 may or may not have internal temperature compensation, but as discussed above, Vcont and/or Vcont2 may be designed to compensate for any temperature effects inherent in the VCO. The VCO is powered from the Vreg, and since Vreg is largely free from Vdd variations, the VCO frequency will demonstrate a high power supply rejection ratio with respect to any Vdd variations.

Figure 4:
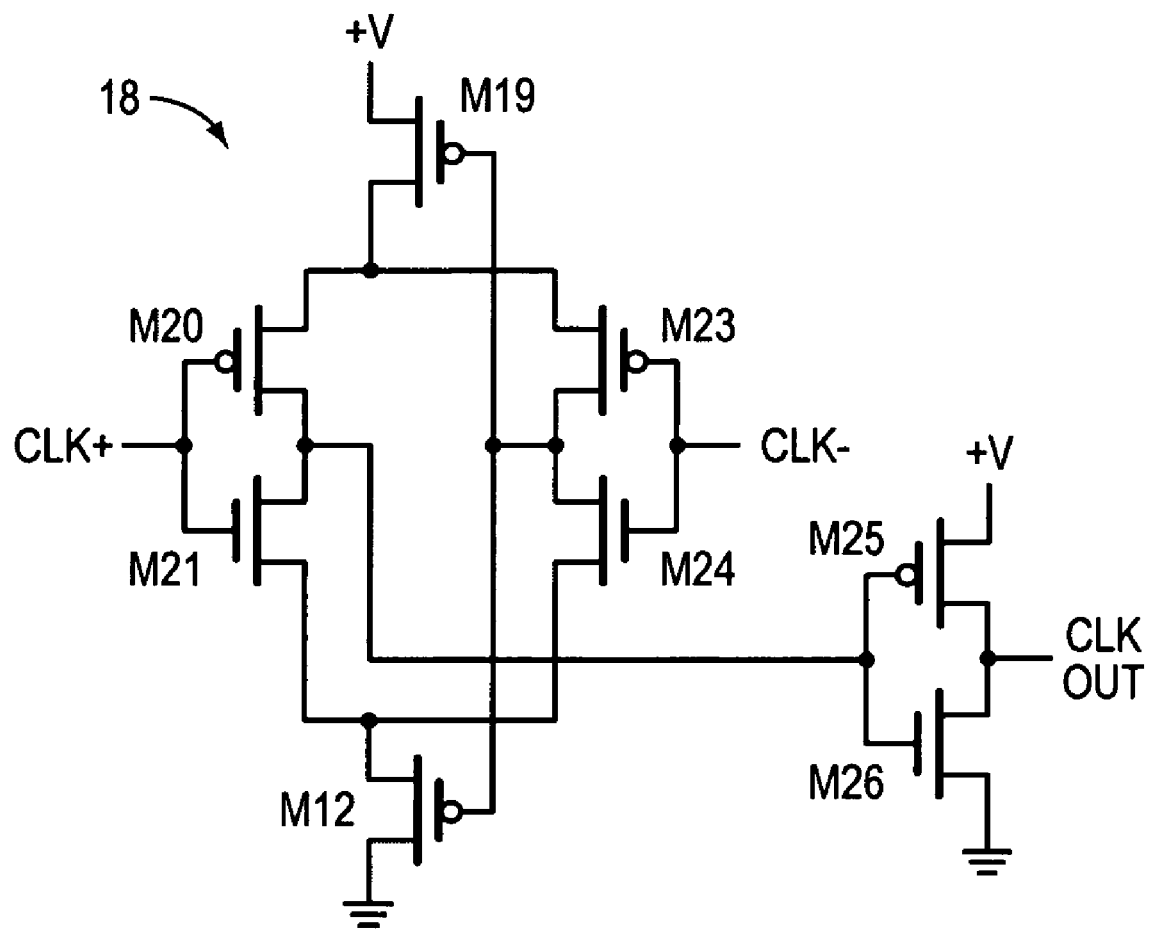
FIG. 4 is a simple self-biased differential input amplifier.

VCO 16 outputs a differential signal that provides an inherent common mode rejection, with respect to the DC levels of the two inputs to the Self-Biased Amplifier 18 from the VCO. The self-biased amplifier 18 improves duty cycle performance of the clock output. FIG. 4 illustrates such a differential input self-biasing amplifier. The inverter M25 and M26 buffers the output to isolate any load capacitance from affecting the amplifier. In one embodiment if the inputs CLK+ and CLK− are held between 1.5V and 3V the operation will be linear, but the CLK+ and CLK− will generally run over these input levels and the CLKOUT will run from ground to +V.

Figure 5:
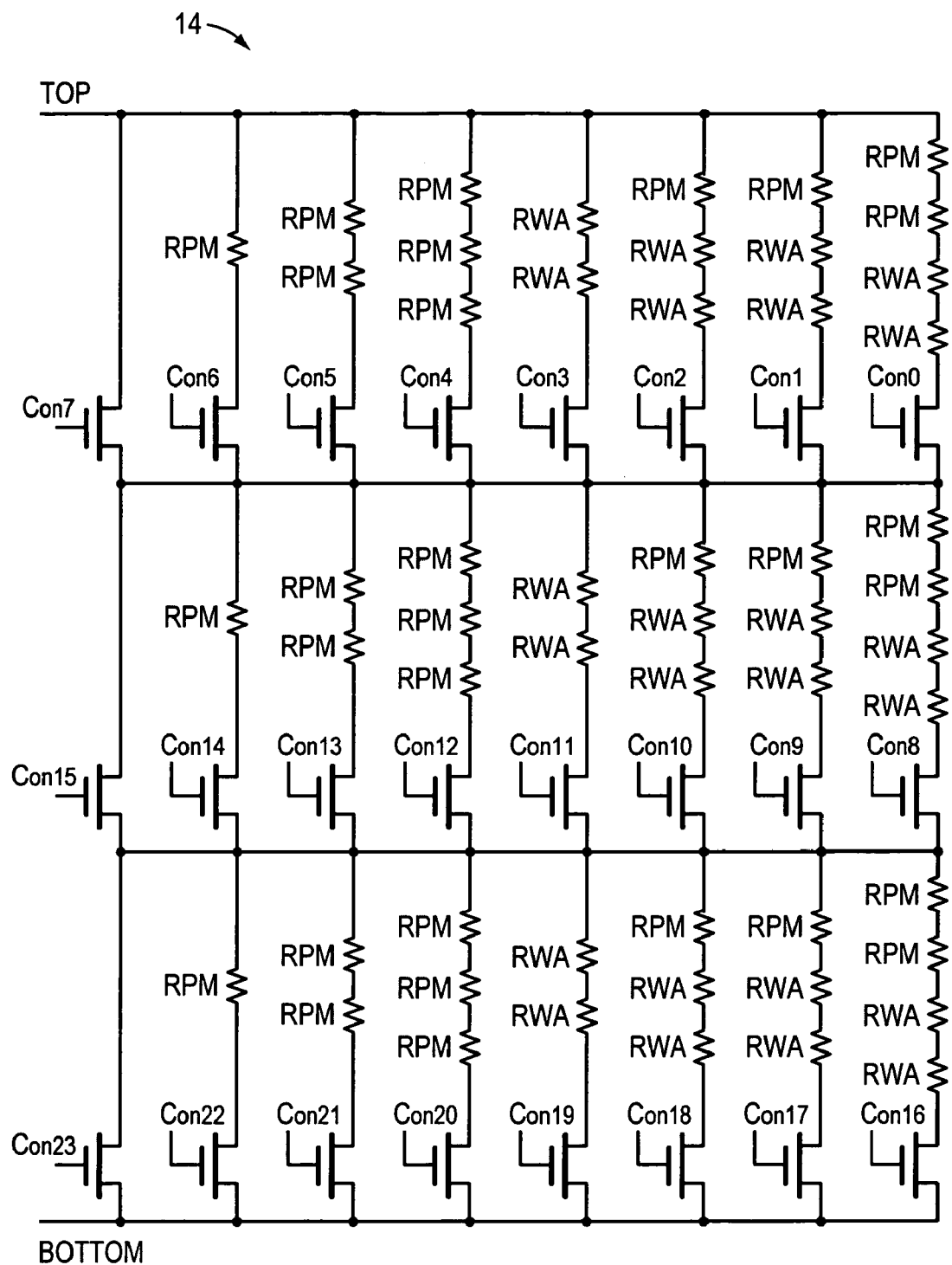
FIG. 5 is a circuit diagram of a selectable series/parallel resistor bank.

FIG. 5 illustrates a variable resistor bank showing twenty-four digital trim pattern inputs. The digital trim inputs 20 (FIG. 1) are marked Con0-Con23.

The Variable ResBank 14 provides a programmable set of resistors in a series/parallel arrangement used to trim the VCO output frequency. Different combinations of the resistors provide different temperature coefficients, even if the different combinations yield equal resistances. The particular selection is determined by a set of logic trim signals derived from a control circuit (not shown). The resistors may be arranged in a series/parallel or "box" fashion where different selections may create the same resistance value and with the IPTAT generator the same Vcont signal to the VCO. Thus the same VCO output frequency maybe created but with different resistor combinations with differing temperature coefficients so that the temperature coefficient of the VCO output clock frequency can be set or trimmed to a very low level. As discussed below, the output clock frequency variations with temperature may be set, via the resistor bank, to a "bowed" relationship that reduces the overall frequency variations with temperature, see FIG. 7.

FIG. 5 is a schematic of the Variable ResBank 14 of FIG. 1. In this embodiment there are twenty-four logic signals that are used to set the "trim pattern" 20. Other embodiments may use fewer or more logic signals to advantage. Please note that the box pattern is a series/parallel arrangement from the "top" to the "bottom." The logic signals, con0 to con 23, drive switches that are powered using one of the available power sources. In preferred embodiments, the resistors consist of different materials with different temperature coefficients and each resistor value has a mirrored value with a different temperature coefficient. The three tiers of resistor combinations allow a flexible tree type arrangement with many possible configurations where resistance value and temperature coefficients over lap each other in different selected combinations.

Figure 6:
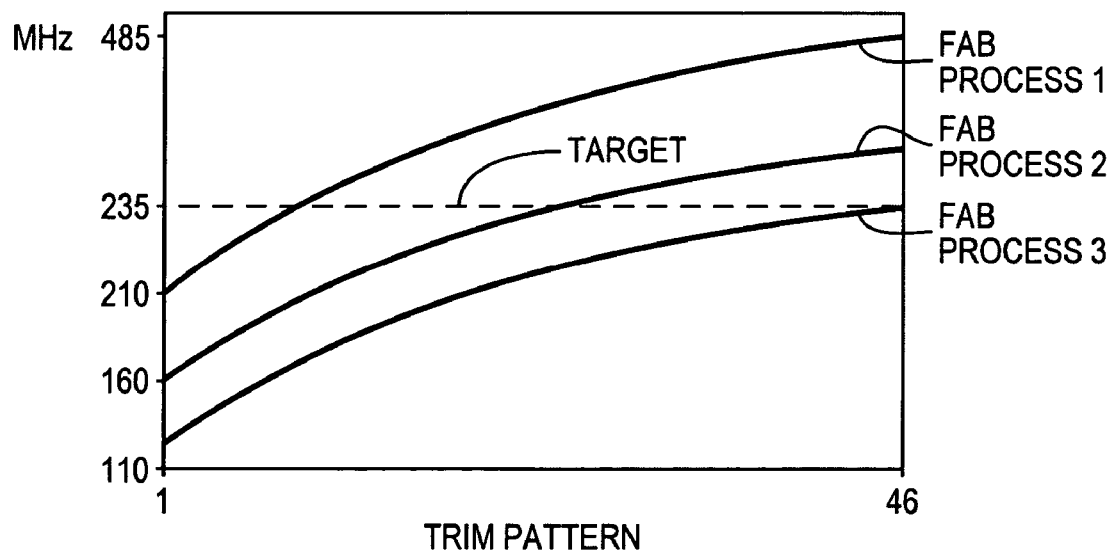
FIG. 6 is a diagram of the digital trim pattern effects on output frequency.

FIG. 6 is a chart of specific examples of logic trim patterns that result in particular frequencies with a specific VCO. Examples for several different fabrication processes are shown. The TARGET would be desired, but the variations of FIG. 4 can be accommodated within preferred designs.

Figure 7:
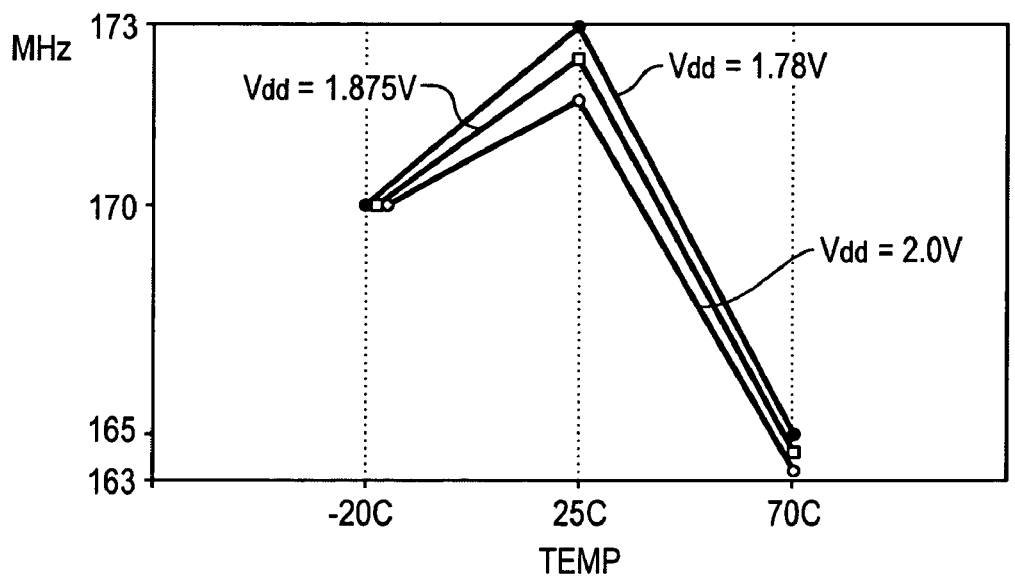
FIG. 7 illustrates the temperature effects of an exemplary circuit using the present invention.

FIG. 7 illustrates VCO frequency variations with respect to temperature. The traces shown illustrate the "bow" effect mentioned above. The VCO 16 frequency may be set at room temperature at 173 MHz by arranging the Vcont (and, if used, Vcont2) where it decreases with both a rise and a fall of the temperature. Differences due to changing the supply voltage are also illustrated. The net effect is to reduce the overall error.

Similar charts apply to examples of fast, medium and slow fabrication processes.

Specific examples have produced variations of frequencies of about +/−0.6 with variations of the Vdd supply from +1.78V to 2.0V. At a Vdd of 1.875V the frequency variation over a 90 degree C. change is about +/−2.8%, and duty cycles vary from +4 to −3% over the above variations of temperature, supply voltage and fabrication processes.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A tunable clock generator comprising:
a VCO having a control input and a power node;
a first IPTAT current generator;
a variable resistor bank receiving current from the first IPTAT current generator;
wherein the IPTAT current generator and the variable resistor bank provide the control input to the VCO; and
wherein the variable resistor bank comprises a set of resistors arranged in selectable combinations of resulting resistances and resulting temperature coefficients, and wherein the selected resulting resistance trims the output frequency of the VCO and the temperature coefficient profile of the clock generator is selectably non-linear over an operating temperature, and wherein the set of resistors are connected in series and in parallel, and a set of switches are connected in series with the resistors, wherein the switches are activated by a set of digital inputs that turn on or off the switches, wherein combinations of different series and parallel resistors are selected, and wherein the resistors have different resistance values and different temperature coefficients, wherein the value of an equivalent resistance for a selected set of series and parallel resistances, and the resulting temperature coefficients for the equivalent resistance is selected to provide a control voltage to the VCO to provide a selected clock frequency with a selected temperature coefficient.

2. The tunable clock generator of claim 1 further comprising:
a second IPTAT current generator; and
a series resistor and band gap diode, wherein the second IPTAT current drives the series resistor and band gap diode forming a reference voltage, wherein the reference voltage is connected to the power node of the VCO.

3. The tunable clock generator of claim 1 wherein the resulting selected resistances and their temperature coefficients over lap with each.

4. The tunable clock generator of claim 3 wherein the temperature coefficient profile forms a bowed contour over the operating temperature range.

5. The tunable clock generator of claim 1 wherein the current generator and the resistor bank compensate for temperature, fabrication processes and supply voltage variations such that the VCO output frequency remains substantially stable over the variations of each of temperature, fabrication processes and supply voltage.

6. The tunable clock generator of claim 1 further comprising a voltage regulator having an output regulated supply that powers the VCO and the first IPTAT current generator.

7. The tunable clock generator of claim 1 wherein the first IPTAT current generator provides a current that is proportional to the absolute temperature.

8. The tunable clock generator of claim 1 wherein the selected temperature coefficient forms a bowed contour over an operating temperature range.

9. The tunable clock generator of claim 1 further comprising a self-biasing amplifier arranged to receive the frequency signal output from the VCO and provided an amplified output frequency signal.

10. The tunable clock generator of claim 1 wherein the variable resistor bank comprises:
a series parallel set of resistors;
a set of switches, that when selected, couple the resistors is configurations to produce a given resistance value with a given temperature coefficient, wherein the values and the temperature coefficients over lap each other, wherein a specific resistance value with a specific temperature coefficient may be selected, but a different selection may produce the same resistance value with a different temperature coefficient, and a different resistance value may be produced with the same temperature coefficient.

11. The tunable clock generator of claim 1 further comprising a second control input to the VCO from the current generator, wherein the IPTAT current generator and the variable resistor bank provide a control signal to the second control input to the VCO.

12. The tunable clock generator of claim 11 wherein the control input and the second control input to the VCO, each are arranged with different temperature coefficients.

13. The tunable clock generator of claim 9 further comprising a second voltage supply powering the self-biasing amplifier that is different from the voltage supply powering the VCO.

14. The tunable clock generator of claim 13 further wherein the second voltage supply comprises a second voltage regulator.

* * * * *

UNITED STATES PATENT AND TRADEMARK OFFICE
CERTIFICATE OF CORRECTION

PATENT NO. : 7,535,309 B2  
APPLICATION NO. : 11/430706  
DATED : May 19, 2009  
INVENTOR(S) : Gregory A. Maher Page 1 of 1

It is certified that error appears in the above-identified patent and that said Letters Patent is hereby corrected as shown below:

On the Title Page, Item (57), the Abstract, should read,

A tunable, low power clock generator employs a voltage regulator, one or <u>two</u> current generators and a variable resistor bank that, together, produce a control voltage for trimming a VCO. The control voltage is arranged to also compensate, at least, for the variables of temperature, supply voltage and fabrication processes as they affect the VCO output frequency. The current generator is well characterized over the variables discussed and the resistor bank is a flexible series/parallel array of resistors made from differing materials exhibiting different temperature coefficients. The resistor bank provides for various overlapping resistance values simultaneously with various overlapping temperature coefficients wherein the temperature coefficient profile of the clock generator over frequency and temperature is controlled.

Signed and Sealed this

First Day of September, 2009

David J. Kappos  
*Director of the United States Patent and Trademark Office*